(12) United States Patent
Toh et al.

(10) Patent No.: US 9,093,551 B2
(45) Date of Patent: Jul. 28, 2015

(54) METHOD AND APPARATUS FOR EMBEDDED NVM UTILIZING AN RMG PROCESS

(75) Inventors: Eng Huat Toh, Singapore (SG); Elgin Quek, Singapore (SG); Shyue Seng Tan, Singapore (SG)

(73) Assignee: GLOBALFOUNDRIES Singapore Pte. Ltd., Singapore (SG)

(*) Notice: Subject to any disclaimer, the term of this patent is extended or adjusted under 35 U.S.C. 154(b) by 0 days.

(21) Appl. No.: 13/543,340

(22) Filed: Jul. 6, 2012

(65) Prior Publication Data

US 2014/0008713 A1    Jan. 9, 2014

(51) Int. Cl.
| | |
|---|---|
| *H01L 21/336* | (2006.01) |
| *H01L 21/8234* | (2006.01) |
| *H01L 21/28* | (2006.01) |
| *H01L 27/115* | (2006.01) |
| *H01L 29/66* | (2006.01) |

(52) U.S. Cl.
CPC .. *H01L 21/823437* (2013.01); *H01L 21/28273* (2013.01); *H01L 21/823425* (2013.01); *H01L 21/823468* (2013.01); *H01L 27/11524* (2013.01); *H01L 29/66545* (2013.01)

(58) Field of Classification Search
None
See application file for complete search history.

(56) References Cited

U.S. PATENT DOCUMENTS

| | | | | |
|---|---|---|---|---|
| 4,091,407 | A  * | 5/1978 | Williams et al. | 257/639 |
| 6,555,427 | B1 * | 4/2003 | Shimizu et al. | 438/238 |
| 7,307,027 | B1 * | 12/2007 | Ngo et al. | 438/778 |
| 2007/0025145 | A1 * | 2/2007 | Mokhlesi et al. | 365/185.01 |

OTHER PUBLICATIONS

Wolf, "Silicon Processing for the VLSI Era—vol. 2: Process Integration," 1990, Lattice Press, vol. 2, p. 176-196.*

* cited by examiner

*Primary Examiner* — Bilkis Jahan
*Assistant Examiner* — Kevin Quinto
(74) *Attorney, Agent, or Firm* — Ditthavong & Steiner, P.C.

(57) ABSTRACT

A memory device is fabricated through the integration of embedded non-volatile memory (eNVM) with RMG processes. Embodiments include forming a first and a second dual polysilicon gate-stack structure on an upper surface of a substrate, forming spacers on opposite sidewalls of each of the first and the second dual polysilicon gate-stack structures, forming an ILD adjacent to an exposed sidewall of each spacer, removing the first dual polysilicon gate-stack structure, forming a first cavity between the spacers, and forming a HKMG in the first cavity, wherein the HKMG forms an access gate.

12 Claims, 5 Drawing Sheets

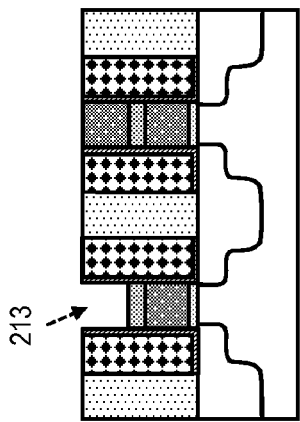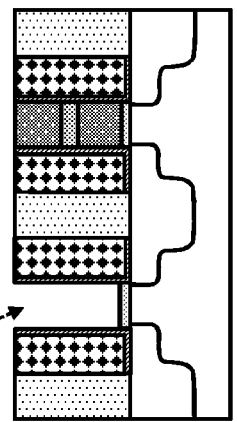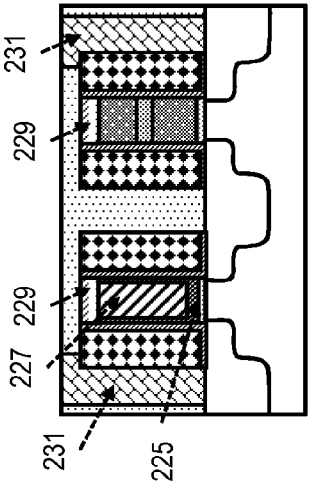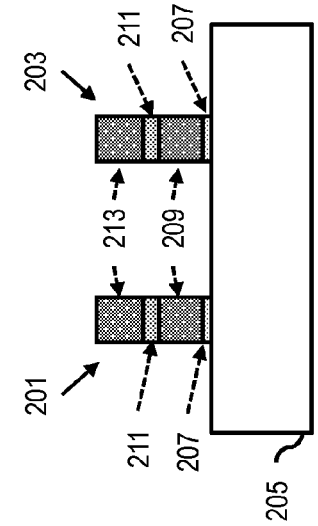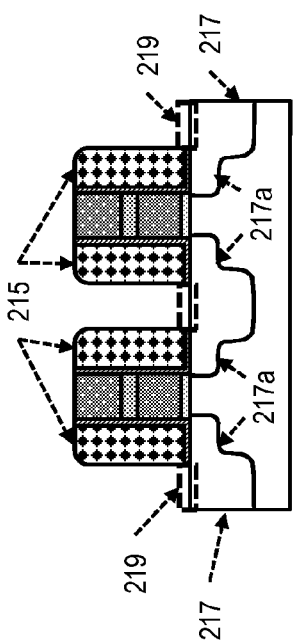

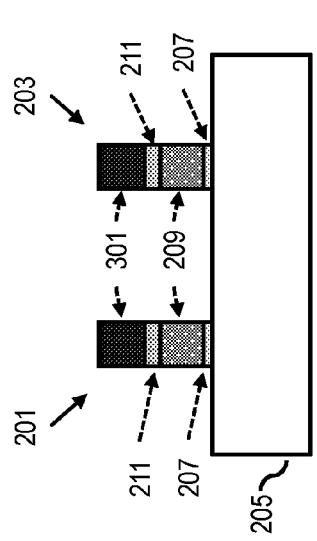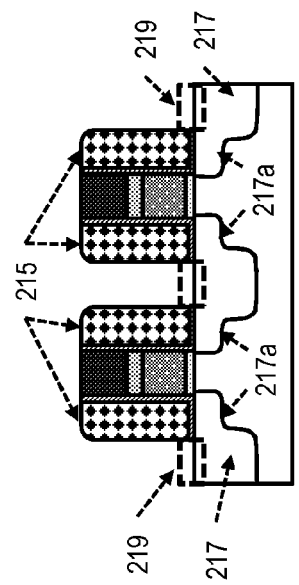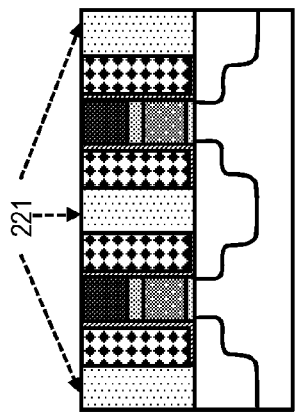
FIG. 4D    FIG. 4E    FIG. 4F
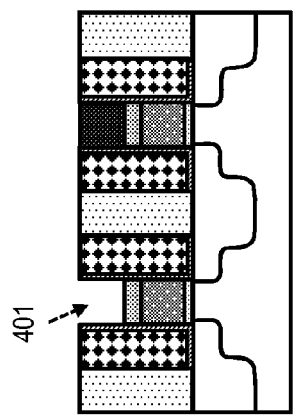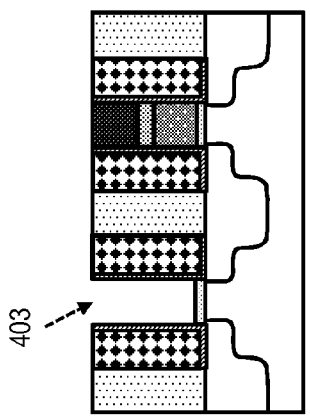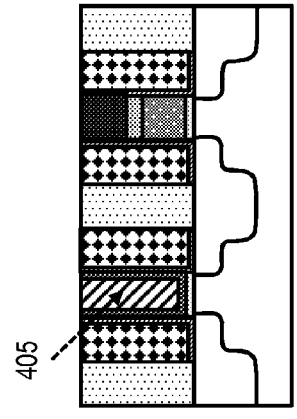
FIG. 4A    FIG. 4B    FIG. 4C

METHOD AND APPARATUS FOR EMBEDDED NVM UTILIZING AN RMG PROCESS

TECHNICAL FIELD

The present disclosure relates to embedded non-volatile memory (eNVM). The present disclosure is particularly applicable to eNVM integrated with replacement gate (RMG) technology.

BACKGROUND

In current processes, an eNVM utilizes a floating-gate (FG) memory as depicted in FIGS. 1A and 1B (side view) for a 2T memory cell, which includes a select transistor 100 (logic cell) and a memory cell 101. The logic cell 100 employs a dual polysilicon (poly) stack with an access gate (AG) 103, and the memory cell 101 includes a floating poly gate (FG) 105, and a control gate (CG) 107. Each stack includes an insulating layer on upper side of a substrate 111, for example a tunnel oxide (TunOx) layer 109a under FG 105 and a dielectric layer 109b (different from TunOx 109a) under AG 103, and a blocking oxide (BlockOx) layer 113 on top of the AG 103 and FG 105 layers. However, this approach increases process complexity such as step height differences between the logic 100 and memory 101 cells causing contact (CA) landing issues. Additionally, both AG/FG and CG need to be doped and a special process is required for landing a contact on the AG. Moreover, like most n+ poly CG/FG memory devices, erase saturation level could be an issue that requires consideration. Overall, the current integration scheme requires additional process steps (e.g., 7 to 9 additional masks), which increase cost and decrease efficiency of the integration process.

A need therefore exists for simpler and more efficient eNVM and RMG compatible integration schemes and enabling methodology.

SUMMARY

An aspect of the present disclosure is a method for fabricating a memory device formed through integration of eNVM with RMG processes.

Another aspect of the present disclosure is a memory device formed through integration of eNVM and RMG processes.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first and a second dual polysilicon gate-stack structure on an upper surface of a substrate; forming spacers on opposite sidewalls of each of the first and the second dual polysilicon gate-stack structures; forming an inter-layer dielectric (ILD) adjacent to an exposed sidewall of each spacer; removing the first dual polysilicon gate-stack structure, forming a first cavity between the spacers; and forming a high-k/metal gate (HKMG) in the first cavity, wherein the HKMG forms an access gate.

Aspects of the present disclosure include forming the first and second dual polysilicon gate-stack structures by: forming a floating gate layer on a tunnel-oxide layer, on the upper surface of the substrate; forming a blocking oxide layer on the floating gate layer; forming a control gate layer on the blocking oxide layer; and etching the floating gate, the blocking oxide, and the control gate layers.

Further aspects of the present disclosure include forming source/drain regions in the substrate for each of the first and second dual polysilicon gate-stack structures prior to forming the ILD. Additional aspects of the present disclosure include forming a hard-mask layer over the HKMG and the second dual polysilicon gate-stack structure; and forming contacts on the source/drain regions through the ILD. Other aspects include forming a silicide on the source/drain regions prior to forming the ILD; forming a hard-mask layer over the HKMG and the second dual polysilicon gate-stack structure; and forming contacts on the silicide.

Another aspect includes forming a first gate-stack structure on an upper surface of a substrate, the first gate-stack structure including a first floating gate layer, a first blocking oxide layer on the first floating gate layer, and a first hard-mask layer on the first blocking oxide layer; forming a second gate-stack structure on the upper surface of the substrate, the second gate stack structure including a second floating gate layer, a second blocking oxide layer on the second floating gate layer, and a second hard-mask layer on the second blocking oxide layer; forming first spacers on opposite sidewalls of the first gate-stack structure and second spacers on opposite sidewalls of the second gate-stack structure; forming an inter-layer dielectric (ILD) adjacent to an exposed sidewall of each first and second spacer; removing the first hard-mask layer, the first blocking oxide layer, and the first floating gate layer, forming a first cavity between the first spacers; and forming a high-k/metal gate (HKMG) in the first cavity.)

Further aspects include removing the second hard-mask layer substantially simultaneously with removal of the first hard-mask layer, forming a second cavity between the second spacers; and forming a second HKMG in the second cavity substantially simultaneously with forming the first HKMG in the first cavity, wherein the first HKMG forms an access gate and the second HKMG forms a control gate. Another aspect includes forming source/drain regions in the substrate for each of the first and second gate-stack structures prior to forming the ILD. Other aspects include forming a hard-mask layer over the first and second HKMGs; and forming contacts on the source/drain regions through the ILD. Additional aspects include removing the second hard-mask, forming a second cavity, subsequent to forming the HKMG; removing an upper portion of the HKMG in the first cavity, forming a third cavity; and filling the second and the third cavities with tungsten. A further aspect includes forming source/drain regions in the substrate for each of the first and second gate-stack structures prior to forming the ILD. Other aspects include forming a hard-mask layer over the tungsten filling the second and third cavities; and forming contacts on the source/drain regions through the ILD.

Another aspect of the present disclosure is a device including a first and a second gate-stack structure on an upper surface of a substrate; first spacers on opposite sidewalls of the first gate-stack structure and second spacers on opposite sidewalls of the second gate-stack structure; an inter-layer dielectric (ILD) adjacent to an exposed sidewall of each first and second spacer; wherein the first gate structure includes a high-k/metal gate (HKMG) in the first cavity and the second gate structure includes a dual polysilicon gate-stack. Additional aspects include the dual polysilicon gate-stack including a floating gate layer on a tunnel-oxide layer, on the upper surface of the substrate; a blocking oxide layer on the floating gate layer; and a control gate layer on the blocking oxide layer. Another aspect includes a device wherein the HKMG forms an access gate. Other aspects include a device wherein the control gate includes a second HKMG. Further aspects include a device including source/drain regions in the substrate for each of the first and second gate-stack structures prior to forming the ILD. Other aspects include a device including a hard-mask layer over the HKMG and the second dual polysilicon gate-stack structure; and contacts on the source/drain regions.

Aspects include a device including a first gate-stack structure on an upper surface of a substrate, the first gate-stack structure including a floating gate layer, a blocking oxide layer on the floating gate layer, and a tungsten layer on the blocking oxide layer; a second gate-stack structure on the upper surface of the substrate, the second gate stack structure including an access gate layer and a tungsten layer on the access gate layer; spacers on opposite sidewalls of each of the first and the second gate-stack structures; an inter-layer dielectric (ILD) adjacent to an exposed sidewall of each spacer; wherein the access gate layer includes a high-k/metal gate (HKMG). Additional aspects include a device including source/drain regions in the substrate for each of the first and second gate-stack structures prior to forming the ILD; a hard-mask layer over the tungsten layers; and contacts on the source/drain regions.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A through 2F schematically illustrate various process steps for the integration of eNVM and RMG, in accordance with an exemplary embodiment of the present disclosure;

FIGS. 4A through 4H schematically illustrate various process steps for the integration of eNVM and RMG, in accordance with another exemplary embodiment of the present disclosure.

DETAILED DESCRIPTION

Figures 1A, 1B:
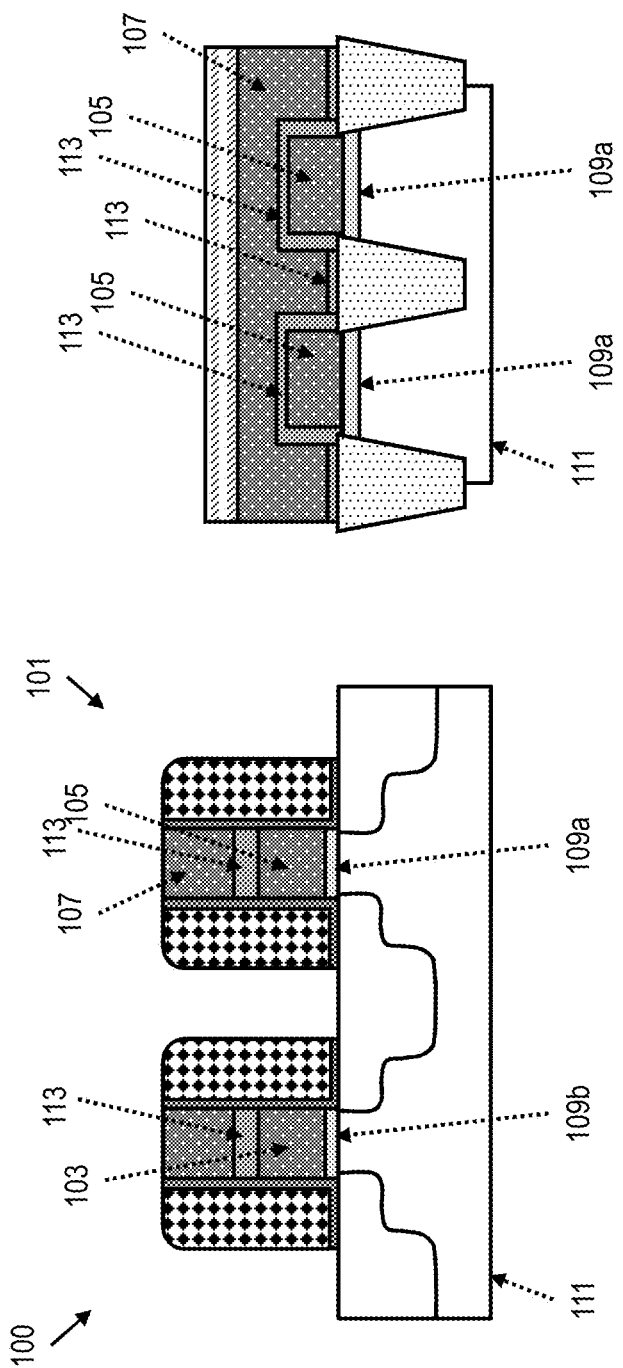
FIGS. 1A and 1B schematically illustrates a background structure resulting from a typical eNVM integration flow.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems of process complexity and contact landing issues attendant upon integrating eNVM and RMG processes. The present disclosure addresses and solves such problems, for example, by forming two dual polysilicon gate-stack structures on the surface of a substrate, one of which acts as a dummy gate-stack, removing the dummy dual polysilicon gate-stack structure to form a cavity between spacers, and forming a high-k/metal gate (HKMG) in the cavity.

Methodology in accordance with embodiments of the present disclosure includes: forming a first and a second dual polysilicon gate-stack structure on an upper surface of a substrate; forming spacers on opposite sidewalls of each of the first and the second dual polysilicon gate-stack structures; forming an inter-layer dielectric (ILD) adjacent to an exposed sidewall of each spacer; removing the first dual polysilicon gate-stack structure, forming a first cavity between the spacers; and forming a high-k/metal gate (HKMG) in the first cavity, wherein the HKMG forms an access gate.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 2A through 2F, 3A through 3F, and 4A through 4F schematically illustrate various process steps for structures formed via integration of eNVM and RMG, in accordance with respective exemplary embodiments of the present disclosure.

FIG. 2F is a schematic illustration of an eNVM utilizing poly FG, poly CG, and RMG AG, formed by the process illustrated in FIGS. 2A through 2F, in accordance with an exemplary embodiment. FIG. 2A illustrates a first (dummy) dual polysilicon gate-stack structure 201 and a second (memory cell) dual polysilicon gate-stack structure 203, both formed on an upper surface of substrate 205, after conventional front-end-of-line (FEOL) integrated circuit (IC) fabrication processes. The dual polysilicon gate-stacks are formed by depositing FG on a TunOx layer 207 and performing an FG slit etch forming an FG layer 209 atop the TunOx layer 207. Next, a BlockOx layer 211 followed by a CG layer 213 are formed atop the FG layer 209. The TunOx may be silicon dioxide, in-situ steam generation (ISSG), an oxide/nitride/oxide (ONO), or any other tunnel dielectric. The BlockOx may be a high-k dielectric, for example hafnium oxide ($HfO_2$), (ISSG), or ONO.

Adverting to FIG. 2B, source/drain extension regions 217a are formed on opposite sides of each gate-stack structure by conventional doping of the silicon substrate. Next, spacers 215 and liner dielectric material are formed on both sides of each of the two gate-stack structures 201 and 203. The spacers 215 and the liner may be formed of oxide or nitride. Once the spacers are formed, source/drain regions 217 are formed in the substrate on opposite sides of each gate-stack structure. Optionally a silicide 219 may be formed on the source/drain regions 217.

As illustrated in FIG. 2C, ILD 221 (e.g., of oxide or nitride) is deposited adjacent to an exposed sidewall of each spacer 215, filling all space between adjacent spacers. A chemical-mechanical polishing (CMP) may be performed to planarize the ILD, spacers, and CG.

Adverting to FIG. 2D, the CG layer 213 of the first gate-structure 201 is removed, for example by a dry and/or a wet etching process. A mask layer is formed atop the CG layer 213 of the second gate-structure 203 to protect the CG layer 213 during the removal of the other CG layer 213. As illustrated in FIG. 2E, a cavity 223 is formed by removing the BlockOx 211 and FG 209 layers of the first gate-structure 201, for example, by a dry and/or a wet etching process.

Adverting to FIG. 2F, a dielectric liner 225 is deposited in the cavity 223, and an RMG 227 is formed as the AG. The dielectric liner 225 includes a high-k dielectric layer. TunOx 207 in gate-structure 201 may be a dummy gate oxide, IO gate oxide, or tunnel oxide layer which may be removed during the formation of cavity 223. Alternatively, TunOx 207 may remain and the overall gate oxide may include both the TunOx 207 and the high-k dielectric layer. As a further alternative, a multi-layer dielectric oxide/high-k dielectric layer may be deposited in cavity 223 as the dielectric liner 225. Hard-mask layers 229 are then formed atop the two gate-structures 201 and 203, to protect the gates during subsequent source/drain contact 231 formation. The contacts 231 may be formed by etching a contact hole through ILD 221 down to source/drain regions 217 and filling the contact hole with metal. The contacts may directly contact the source/drain regions 217 or may be formed on optional silicide 219. Alternatively, after the contact hole etch, silicidation may be performed, and the contact hole filled with metal. The contact 231 may be borderless or self-aligned depending on the technology utilized and/or available. Subsequently, conventional back-end-of-line (BEOL) steps may commence for completion of the IC fabrication process. The use of RMG for the AG results in a higher performance select transistor, and no special contact landing is required for the AG. In addition, the memory cell has a poly FG storage node and a poly CG, and ERS saturation may be improved due to a high work function CG such as a p+ poly. Also, the FG and CG polysilicon may be predoped, since they will be removed from the logic and select transistor, and only one additional mask is required for the selective FG removal (as opposed to 7 to 9 masks in the prior art). Accordingly, the process is simpler and lower cost. It is noted that the memory cell operations are not restrictive and would operate in a similar fashion as current devices utilizing FG eNVM technology. For example, program and erase operations may be carried out by Fowler-Nordheim (FN) tunneling. Furthermore, the proposed integration process still supports NOR and NAND array configurations with no limitations on program, erase, and read operations.

Figure 3D:
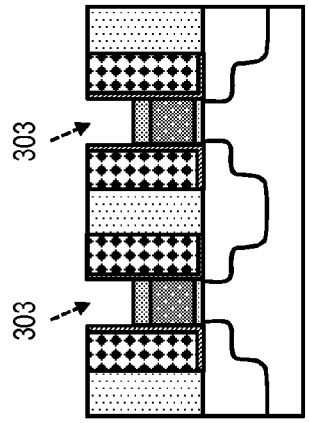
FIGS. 3A through 3F schematically illustrate various process steps for the integration of eNVM and RMG, in accordance with another exemplary embodiment of the present disclosure.
Figure 3E:
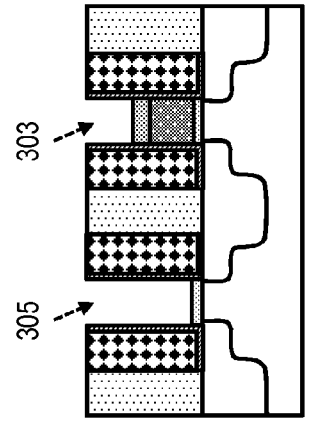
Figure 3F:
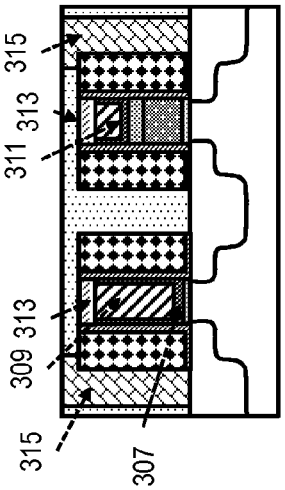
Figure 3A:
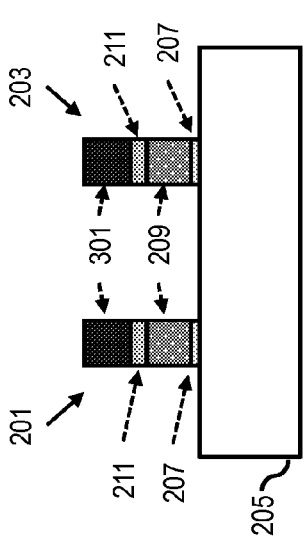
Figure 3B:
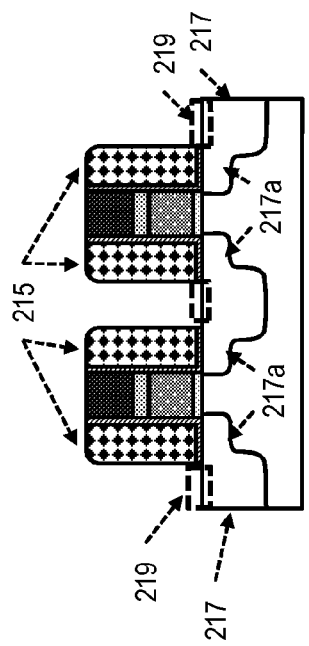
Figure 3C:
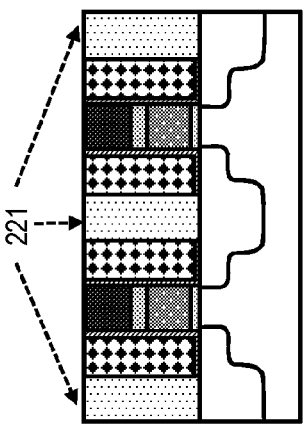

FIG. 3F is a schematic illustration of an eNVM utilizing a poly FG, RMG CG, and RMG AG, formed by the process illustrated in FIGS. 3A through 3F, in accordance with another exemplary embodiment. FIGS. 3A through 3C are similar to those of 2A through 2C except for the top layer of each of the two gate-stacks. For example, FIG. 3A illustrates a first (dummy) gate-stack structure 201 and a second (memory cell) gate-stack structure 203, which are formed on an upper surface of substrate 205, for example, subsequent to conventional FEOL IC fabrication processes. As in the embodiment illustrated in FIGS. 2A through 2F, the gate-stacks are formed by first depositing FG on a TunOx layer 207 on a substrate 205 and performing an FG slit etch, forming an FG layer 209 atop the TunOx layer 207. Next, a BlockOx layer is formed on the two FG layers 209. FIG. 3A differs from FIG. 2A in that the first and the second gate-structures of FIG. 3A include a hard-mask (HM) layer 301 formed atop the BlockOx layer 211. HM 301 may be formed, for example, of TiN, $Al_2O_3$, nitride, oxide, polysilicon or amorphous silicon.

FIG. 3B illustrates the formation of source/drain regions 217a, spacers 215 and liner dielectric material on both sides of each of the two gate-stack structures 201 and 203. The spacers 215 and the liner may be formed of oxide or nitride. Furthermore, source/drain regions 217 are formed in the substrate on opposite sides of each gate-stack structure. An optional silicide layer 219 may be formed on the source/drain regions.

Adverting to FIG. 3C, an ILD 221 (e.g., of oxide or nitride) is deposited adjacent to an exposed sidewall of each spacer 215 and filling all space between adjacent spacers, followed by a CMP process. FIG. 3D illustrates the removal of the HM layer 301 of the first and second gate-structures 201 and 203, for example, by a dry and/or a wet etching process, forming cavities 303. FIG. 3E shows forming a cavity 305 by removing the BlockOx 211 and FG 209 of the first gate-structure 201, for example, by a dry and/or a wet etching process.

FIG. 3F illustrates forming a high-k dielectric liner 307 and an RMG 309 in the cavity 305, forming an AG. Concurrently, a high-k dielectric layer and an RMG 311 are formed in cavity 303 as a CG. Hard-mask layers 313 are then formed atop the two gate-structures 201 and 203 and source/drain contacts 315 are formed either on the source/drain regions 217, on optional silicide 219, or a silicide is formed subsequent to formation of the hard-mask layers 313, and contacts 315 are formed thereon. Subsequently, conventional back-end-of-line (BEOL) steps continue for completion of the IC fabrication process. In the process of FIGS. 3A through 3F, the use of RMG for the AG results in a higher performance select transistor, no special contact landing is required for the AG, and ERS saturation may be improved with a high work function RMG CG (e.g., a P-channel field-effect-transistor (PFET) gate stack with a high-k/work-function tuning layer). Further, there is no dual poly layer complexity, the poly FG may be pre-doped, the AG and the CG may employ different types of gate stacks, for example, the AG may utilize N-channel field-effect-transistor (NFET) logic HKMG stack (which may be formed on top of a thick gate oxide), and the memory cell 203 may utilize a PFET logic HKMG stack for improved erase saturation. Also, only one additional mask is required for the selective FG removal as in the embodiment of FIGS. 2A through 2F.

Figure 4G:
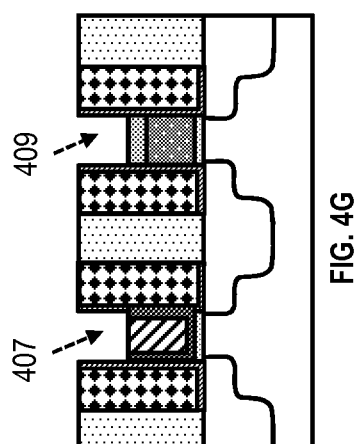
Figure 4H:
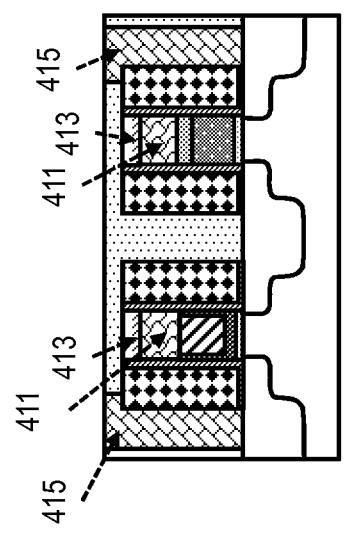

FIG. 4H is a schematic illustration of an eNVM utilizing a poly FG, W CG, and RMG AG, formed by the process illustrated in FIGS. 4A through 4H, in accordance with another exemplary embodiment. The process begins similar to the process steps of FIGS. 3A through 3C. For example, FIG. 4A illustrates a first (dummy) gate-stack structure 201 and a second (memory cell) gate-stack structure 203, which are formed on an upper surface of substrate 205, for example, after conventional FEOL IC fabrication processes. The gate-stack formation may include deposition of FG polysilicon on a TunOx layer 207 on an upper surface of the substrate 205 and an FG slit etch to form an FG layer 209 atop the TunOx layer 207. A BlockOx layer 211 may be formed on the FG layer 209, followed by a HM layer 301 on the BlockOx layer 211.

Adverting to FIG. 4B, source/drain extension regions 217a, spacers 215 and liner dielectric material are formed on both sides of each of the two gate-stack structures 201 and 203. The spacers 215 and the liner may be formed of an oxide or a nitride. Next, source/drain regions 217 are formed with an optional silicide 219. FIG. 4C shows ILD 221 (e.g., of oxide or nitride) deposited adjacent to an exposed sidewall of each spacer 215, and filling all space between the spacers, followed by CMP.

As illustrated in FIG. 4D, HM layer 301 of the first gate-structure 201 is removed, for example, by a dry and/or a wet etching process, forming a first cavity 401. In FIG. 4E, the FG layer 209 and BlockOx layer 211 are also removed, forming cavity 403. Adverting to FIG. 4F, an RMG AG is formed in cavity 403. A high-k dielectric liner (with or without work-function tuning layer) and metal gate of titanium nitride (TiN) or aluminum (Al) may be employed, forming an HKMG 405 as the AG.

FIG. 4G illustrates removing an upper portion of RMG 405 to form a cavity 407 and removing the HM 301 of the second gate-stack 203 to form a cavity 409. As illustrated in FIG. 4H cavities 407 and 409 in the gate-stacks 201 and 203, respectively, are then filled with tungsten 411. Hard-mask layers 413 are then formed on the two gate-structures 201 and 203 and source/drain contacts 415 are formed either on the source/drain regions 217, on optional silicide 219, or a silicide is formed subsequent to formation of the hard-mask layers 413, and contacts 415 are formed thereon. Conventional back-end-of-line (BEOL) steps may then proceed for completion of the IC fabrication process. As in the embodiment of FIGS. 3A through 3F, the use of RMG for the AG results in a higher performance select transistor, and no special contact landing is required for the AG. Also, there is no dual poly layer complexity, the poly FG may be a storage node, and only one additional mask is required for the selective FG removal. Accordingly, the process is simpler and lower cost.

The embodiments of the present disclosure can achieve several technical effects, including integrating eNVM and RMG processes, eliminating the need for special contact connection to AG, improving ERS saturation, reducing the number of masks required, simplifying the process, and overall reducing cost. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a first dual polysilicon gate-stack structure and a second dual polysilicon gate-stack structure on an upper surface of a substrate;
   forming spacers on opposite sidewalls of the first dual polysilicon gate-stack structure and the second dual polysilicon gate-stack structure;
   forming an inter-layer dielectric (ILD) adjacent to an exposed sidewall of the spacers;
   removing the first dual polysilicon gate-stack structure, forming a first cavity between the spacers; and
   forming a high-k/metal gate (HKMG) in the first cavity, wherein the HKMG comprises an access gate.

2. The method according to claim 1, further comprising forming the first dual polysilicon gate-stack structure and the second dual polysilicon gate-stack structure by:
   forming a floating gate layer on a tunnel-oxide layer, on the upper surface of the substrate;
   forming a blocking oxide layer on the floating gate layer;
   forming a control gate layer on the blocking oxide layer; and
   etching the floating gate, the blocking oxide, and the control gate layers.

3. The method according to claim 1, further comprising:
   forming source/drain regions in the substrate for the first dual polysilicon gate-stack structure and the second dual polysilicon gate-stack structure prior to forming the ILD.

4. The method according to claim 3, further comprising:
   forming a hard-mask layer over the HKMG and the second dual polysilicon gate-stack structure; and
   forming contacts on the source/drain regions through the ILD.

5. The method according to claim 3, further comprising:
   forming a silicide on the source/drain regions prior to forming the ILD;
   forming a hard-mask layer over the HKMG and the second dual polysilicon gate-stack structure; and
   forming contacts on the silicide.

6. A method comprising:
   forming a first gate-stack structure on an upper surface of a substrate, the first gate-stack structure comprising a first floating gate layer, a first blocking oxide layer on the first floating gate layer, and a first hard-mask layer on the first blocking oxide layer;
   forming a second gate-stack structure on the upper surface of the substrate, the second gate stack structure comprising a second floating gate layer, a second blocking oxide layer on the second floating gate layer, and a second hard-mask layer on the second blocking oxide layer;
   forming first spacers on opposite sidewalls of the first gate-stack structure and second spacers on opposite sidewalls of the second gate-stack structure;
   forming an inter-layer dielectric (ILD) adjacent to an exposed sidewall of the first spacers and the second spacers;
   removing the first hard-mask layer, the first blocking oxide layer, and the first floating gate layer, forming a first cavity between the first spacers; and
   forming a first high-k/metal gate (HKMG) in the first cavity.

7. The method according to claim 6, further comprising:
   removing the second hard-mask layer substantially simultaneously with removal of the first hard-mask layer, forming a second cavity between the second spacers; and
   forming a second HKMG in the second cavity substantially simultaneously with forming the first HKMG in the first cavity, wherein the first HKMG comprises an access gate and the second HKMG comprises a control gate.

8. The method according to claim 7, further comprising:
   forming source/drain regions in the substrate for the first gate-stack structure and the second gate-stack structure prior to forming the ILD.

9. The method according to claim 8, further comprising:
forming a hard-mask layer over the first HKMG and the second HKMG; and
forming contacts on the source/drain regions through the ILD.

10. The method according to claim 6, further comprising:
removing the second hard-mask, forming a second cavity, subsequent to forming the first HKMG;
removing an upper portion of the first HKMG in the first cavity, forming a third cavity; and
filling the second cavity and the third cavity with tungsten.

11. The method according to claim 10, further comprising:
forming source/drain regions in the substrate for the first gate-stack structure and the second gate-stack structure prior to forming the ILD.

12. The method according to claim 11, further comprising:
forming a hard-mask layer over the tungsten, the second cavity, and the third cavity; and
forming contacts on the source/drain regions through the ILD.

* * * * *